(12) United States Patent  
Park et al.

(10) Patent No.: US 9,076,548 B1
(45) Date of Patent: Jul. 7, 2015

(54) SEMICONDUCTOR MEMORY DEVICE INCLUDING REFRESH CONTROL CIRCUIT AND METHOD OF REFRESHING THE SAME

(71) Applicants: Duk-Ha Park, Suwon-Si (KR); Chul-Sung Park, Seoul (KR); Jung-Bae Lee, Seongnam-Si (KR)

(72) Inventors: Duk-Ha Park, Suwon-Si (KR); Chul-Sung Park, Seoul (KR); Jung-Bae Lee, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 14/056,995

(22) Filed: Oct. 18, 2013

Related U.S. Application Data

(60) Provisional application No. 61/729,355, filed on Nov. 22, 2012.

(51) Int. Cl.
  *G11C 7/00* (2006.01)
  *G11C 11/402* (2006.01)
(52) U.S. Cl.
  CPC .................................... *G11C 11/402* (2013.01)
(58) Field of Classification Search
  CPC .................. G11C 11/406; G11C 11/40615
  USPC .................................................. 365/222, 236
  See application file for complete search history.

(56) References Cited

U.S. PATENT DOCUMENTS

| 6,501,699 | B2 | 12/2002 | Mizugaki |
| 6,948,029 | B2 | 9/2005 | Yano |
| 7,082,073 | B2 | 7/2006 | Casper |
| 7,408,828 | B1 | 8/2008 | Casper |
| 7,995,415 | B2 | 8/2011 | Casper |
| 2005/0289294 | A1 | 12/2005 | Janzen |
| 2012/0307582 | A1* | 12/2012 | Marumoto et al. ........... 365/222 |

FOREIGN PATENT DOCUMENTS

| JP | 3726661 | 3/2003 |
| KR | 10861439 | 9/2008 |
| KR | 10887527 | 3/2009 |

* cited by examiner

*Primary Examiner* — Huan Hoang
(74) *Attorney, Agent, or Firm* — Volentine & Whitt, PLLC

(57) ABSTRACT

A method of refreshing a semiconductor memory device includes performing a first refresh operation for memory cells included in a memory cell array, and determining whether a command other than a refresh command is applied to the semiconductor memory device in a refresh cycle of the first refresh operation. The method further includes continuing to perform the first refresh operation when a command other the refresh command is applied to the semiconductor memory device in one refresh cycle of the first refresh operation, and performing a second refresh operation when a command other than the refresh command is not applied to the semiconductor memory device in one refresh cycle of the first refresh operation. A refresh time of the second refresh operation is greater than a refresh time of the first refresh operation.

20 Claims, 15 Drawing Sheets

ND METHOD OF REFRESHING THE SAME

SEMICONDUCTOR MEMORY DEVICE INCLUDING REFRESH CONTROL CIRCUIT AND METHOD OF REFRESHING THE SAME

CROSS-REFERENCE TO RELATED APPLICATION

A claim of priority is made to U.S. provisional application No. 61/729,355, filed Nov. 22, 2012, the disclosure of which is incorporated herein by reference in its entirety.

BACKGROUND

Embodiments of the inventive concept relate to semiconductor memory devices, and more particularly, to methods of and circuits for refreshing a semiconductor memory device.

Refresh operations are carried out to compensate for the degradation of stored data over time in certain types of memory devices. For example, in the case of dynamic random access memory (DRAM), the gradual charge leakage of a capacitive memory cell element may eventually result in the memory cell taking on an erroneous data state. As such, it may be necessary to periodically refresh the data state of the memory cell to avoid and/or reduce read errors.

SUMMARY

In accordance with an aspect of the inventive concept, a method of refreshing a semiconductor memory device is provided. The method includes performing a first refresh operation for memory cells included in a memory cell array, and determining whether a command other than a refresh command is applied to the semiconductor memory device in a refresh cycle of the first refresh operation. The method further includes continuing to perform the first refresh operation when a command other than the refresh command is applied to the semiconductor memory device in one refresh cycle of the first refresh operation, and performing a second refresh operation when a command other than the refresh command is not applied to the semiconductor memory device in one refresh cycle of the first refresh operation. A refresh time of the second refresh operation is greater than a refresh time of the first refresh operation.

In accordance with another aspect of the inventive concept, a semiconductor memory device is provided which includes a refresh control circuit configured to generate a refresh address based on an active master signal and a refresh command, a multiplexing circuit configured to select one of an external address and the refresh address to generate a row address, a row decoder configured to decode the row address and provide the decoded row address to a memory cell array, a column address buffer configured to generate a column address based on the external address, and a column decoder configured to decode the column address and provide the decoded column address to the memory cell array. The semiconductor memory device is configured to continue performance of a first refresh operation when a command other than the refresh command is applied to the semiconductor memory device in one refresh cycle of the first refresh operation, and to perform a second refresh operation when a command other than the refresh command is not applied to the semiconductor memory device in one refresh cycle of the first refresh operation, wherein a refresh time of the second refresh operation is greater than a refresh time of the first refresh operation.

BRIEF DESCRIPTION OF THE DRAWINGS

The foregoing and other aspects and features of the inventive concepts will become apparent from the detailed description that follows, with reference to the accompanying drawings in which like reference characters refer to like elements throughout the different views. The drawings are not necessarily to scale, emphasis instead being placed upon illustrating principles of the inventive concepts. In the drawings.

DETAILED DESCRIPTION OF THE EMBODIMENTS

Figure 1:
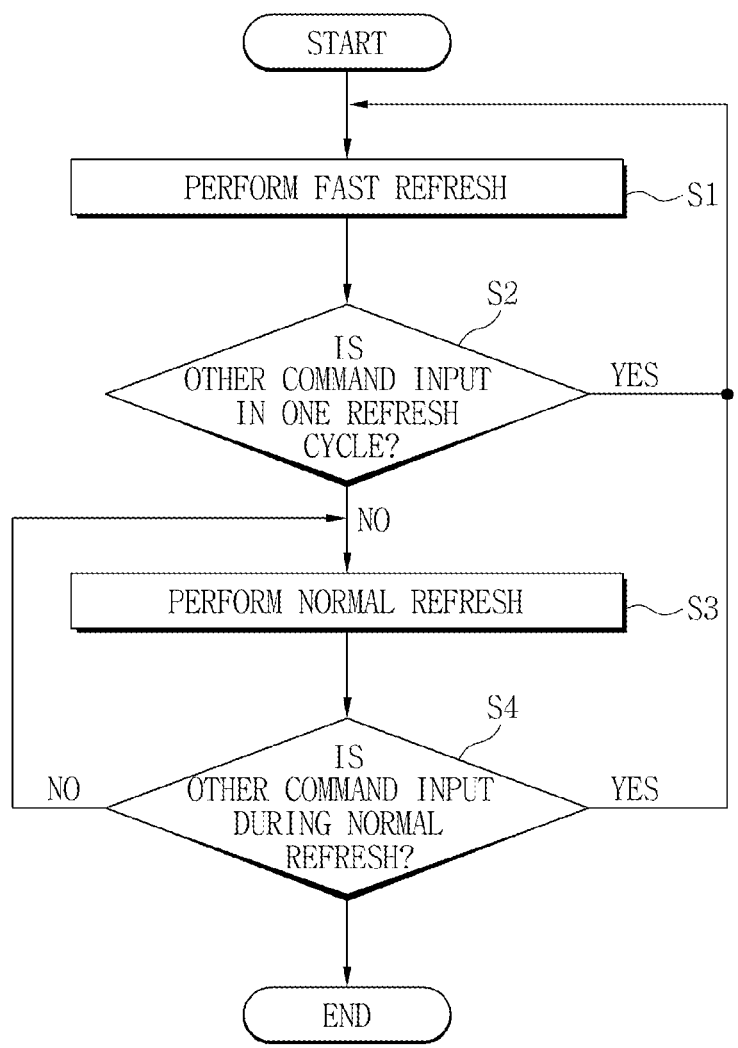
FIG. 1 is a flowchart for reference in describing a method of refreshing a semiconductor memory device in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the inventive concept will be described with reference to the accompanying drawings.

FIG. 1 is a flowchart for reference in describing a method of refreshing a semiconductor memory device in accordance with an embodiment of the inventive concept.

Referring to FIG. 1, initially a first refresh operation (which may be referred to as a fast refresh operation) is carried out for memory cells included in a memory cell array of a semiconductor memory device (S1). It is then determined whether a command other than a refresh command has been received by (input to) the semiconductor memory device during one refresh cycle of the fast refresh operation (S2). In the case where a command other than a refresh command has been received by the semiconductor memory (YES at S2), the method returns to (S1) to carry out the fast refresh operation. On the other hand, in the case where a command other than a refresh command has not been received (NO at S2), a second refresh operation (which may be referred to as a normal refresh operation) is performed for the memory cells included in the memory cell array (S3).

The method associated with in FIG. 1 may further include determining whether a command other than a refresh command has been received by (input to) the semiconductor memory device during the normal refresh operation (S4). In the case where a command other than a refresh command has been received by the semiconductor memory (YES at S4), the method returns to (S1) to perform the fast refresh operation. On the other hand, the method is considered complete in the case where a command other than refresh command has not been received during the normal refresh operation (NO at S4).

Figure 2:
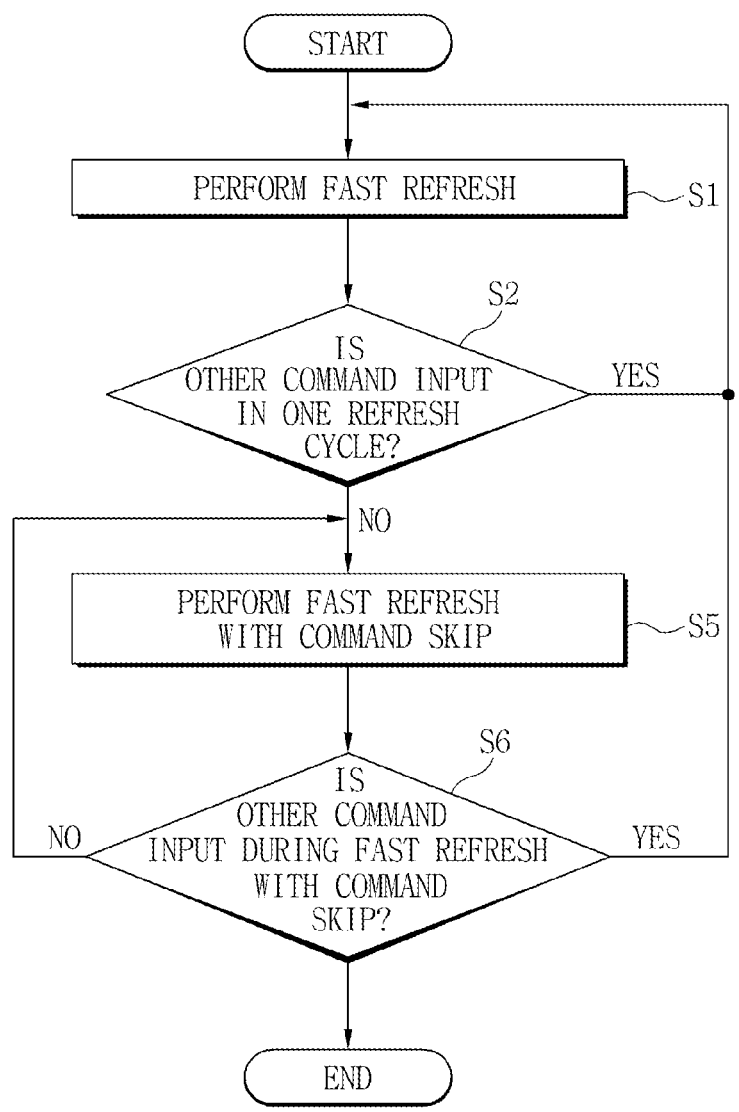
FIG. 2 is a flowchart for reference in describing a method of refreshing a semiconductor memory device in accordance with another embodiment of the inventive concept.

FIG. 2 is a flowchart for reference in describing a method of refreshing a semiconductor memory device in accordance with another embodiment of the inventive concept.

Referring to FIG. 2, initially a first refresh operation (which may be referred to as fast refresh operation) is carried out for memory cells included in a memory cell array of a semiconductor memory device (S1). It is then determined whether a command other than a refresh command has been received by (input to) the semiconductor memory device during one refresh cycle of the fast refresh operation (S2). In the case where a command other than a refresh command has been received by the semiconductor memory (YES at S2), the method returns to (S1) to carry out the fast refresh operation. On the other hand, in the case where a command other than a refresh command has not been received (NO at S2), a second refresh operation (which may be referred to as a fast refresh with command skip operation) is performed for the memory cells included in the memory cell array (S5).

The method associated with in FIG. 2 may further include determining whether a command other than a refresh command has been received by (input to) the semiconductor memory device during the fast refresh with command skip operation (S6). In the case where a command other than a refresh command has been received by the semiconductor memory (YES at S6), the method returns to (S1) to perform the fast refresh operation. On the other hand, the method is considered complete in the case where a command other than refresh command has not been received during the normal refresh operation (NO at S6).

The refresh commands referred to in connection with FIGS. 1 and 2 may, for example, be an auto refresh command or a self refresh command. Further, a refresh time of the first refresh operation (e.g., the fast refresh operation) is less than that of second refresh operation (e.g., the normal refresh operation or the fast refresh with command skip operation). Put another way, a refresh rate of the first refresh operation is greater than a refresh rate of the second refresh operation. For example, a refresh time of the fast refresh operation may be half of a refresh time of the normal refresh operation. The commands other than a refresh command referred to above may, for example, be an active command, a read command and a write command.

Figure 3:
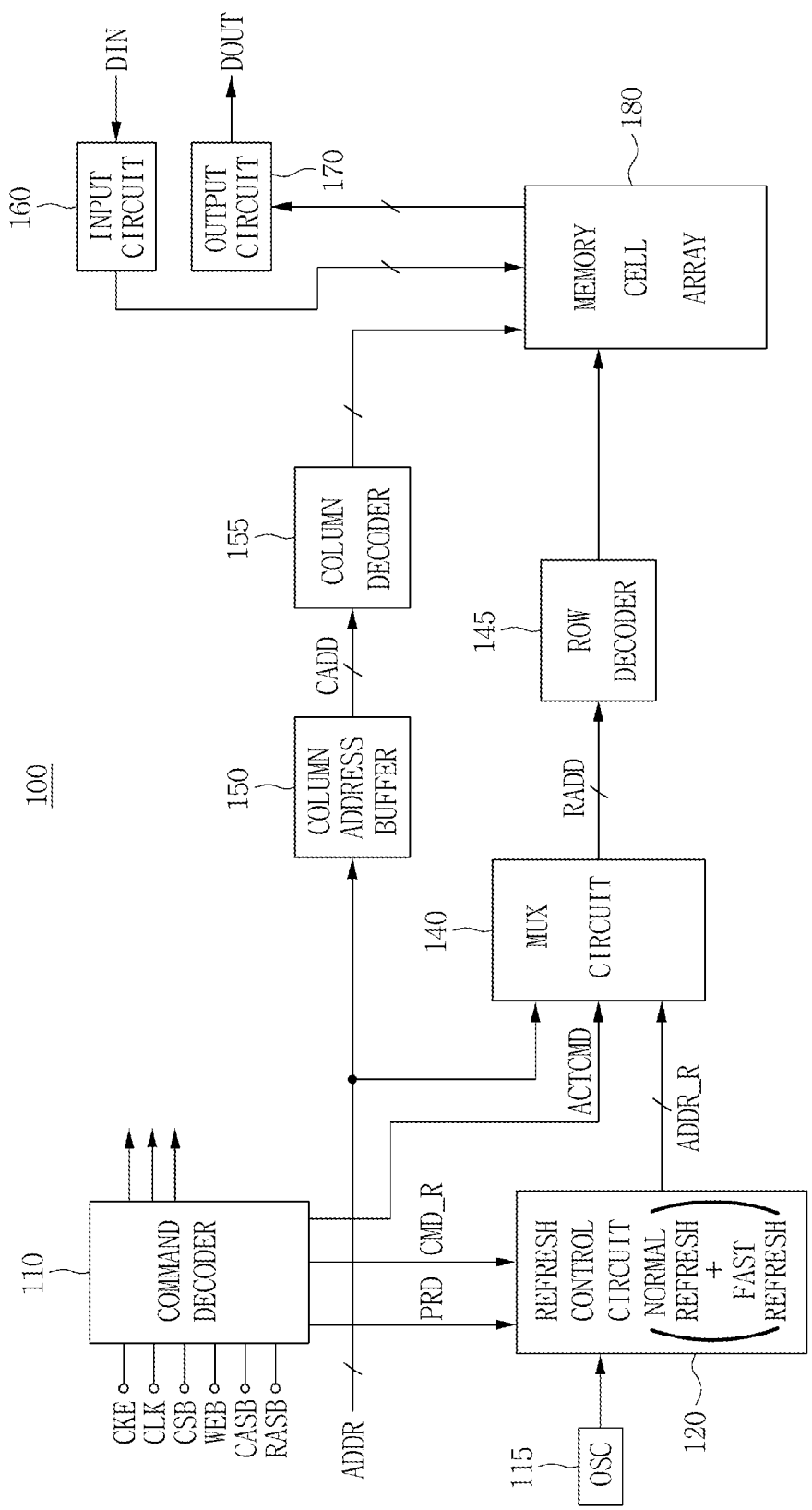
FIG. 3 is a block diagram illustrating a semiconductor memory device including a refresh control circuit in accordance with an embodiment of the inventive concept.

FIG. 3 is a block diagram illustrating a semiconductor memory device 100 including a refresh control circuit in accordance with an embodiment of the inventive concept.

Referring to FIG. 3, the semiconductor memory device 100 of this example includes a command decoder 110, an oscillator 115, a refresh control circuit 120, a multiplexing circuit 140, a row decoder 145, a column address buffer 150, a column decoder 155, an input circuit 160, an output circuit 170 and a memory cell array 180. The refresh control circuit 120 of this example is operable in a normal refresh mode and a fast refresh mode. In another example, the refresh control circuit 120 is operable in the fast refresh mode and a fast refresh with command skip mode.

In operation, the command decoder 110 receives an externally supplied clock enable signal CKE, clock signal CLK, chip selecting signal CSB, write enable signal WEB, column address strobe signal CASB and row address strobe signal RASB. Among these, the command decoder 110 may utilize the write enable signal WEB, the column address strobe signal CASB and the row address strobe signal RASB to generate various commands and control signals necessary for operation of the semiconductor memory device 100.

The oscillator 115 generates an oscillating signal which is applied to the refresh control circuit 120.

The refresh control circuit 120 receives the oscillating signal, as well as an active master signal PRD and a refresh command CMD_R from the command decoder 110. Further, the refresh control circuit 120 generates a refresh address ADDR_R based on the active master signal PRD, the refresh command CMD_R and the oscillating signal.

The multiplexing circuit 140 operates in response to an active command ACTCMD received from the command decoder 110, and selects one of an external address ADDR and the refresh address ADDR_R to generate a row address RADD.

The row decoder 145 decodes the row address RADD and supplies an appropriate row voltage to corresponding row of the memory cell array 180.

The column address buffer 150 generates a column address CADD based on the external address ADDR, and supplies the column address CADD to the column decoder 155.

The column decoder 155 decodes the column address CADD, and supplies an appropriate column voltage to a corresponding column of the memory cell array 180.

The semiconductor memory device 100 of FIG. 3 is responsive to the row decoder 145 and column decoder 155 to write data to the memory cell array 180 and/or read data from the memory cell array 180. In this respect, the semiconductor memory device 100 of this example further includes the input buffer (or circuit) 160 to buffer input data DIN to be written to the memory cell array 180, and the output buffer (or circuit) 170 to buffer output data DOUT read from the memory cell array 180.

Under control of the command decoder 110 and refresh control circuit 120, the semiconductor memory device 100 is operative execute the methods associated with FIGS. 1 and/or 2 described previously. Namely, the semiconductor memory device 100 is operative to perform a fast refresh operation when a command other than a refresh command is applied to the semiconductor memory device in one refresh cycle of the fast refresh operation, and to perform a normal refresh operation or a fast refresh with command skip operation when a command other than the refresh command is not applied to the semiconductor memory device in one refresh cycle of the fast refresh operation.

For example, in the case of FIG. 1, the refresh control circuit 120 may generate the refresh address ADDR_R in a fast refresh mode when a command other than the refresh command is applied to the semiconductor memory device in one refresh cycle of the fast refresh operation, and may generate the refresh address ADDR_R in a normal refresh mode when a command other than the refresh command is not applied to the semiconductor memory device in one refresh cycle of the fast refresh operation. The refresh control circuit 120 may also generate the refresh address ADDR_R in a fast refresh mode when a command other than the refresh command is applied to the semiconductor memory device while the semiconductor memory device is performing the normal refresh operation, and may generate the refresh address ADDR_R in a normal refresh mode when a command other than the refresh command is not applied to the semiconductor memory device while the semiconductor memory device is performing the normal refresh operation.

On the other hand, in the case of FIG. 2, the refresh control circuit 120 may generate the refresh address ADDR_R in a fast refresh mode when a command other than the refresh command is applied to the semiconductor memory device while the semiconductor memory device is performing the normal refresh operation, and may generate the refresh address ADDR_R in a normal refresh mode when a command other than the refresh command is not applied to the semiconductor memory device while the semiconductor memory device is performing the normal refresh operation. The refresh control circuit 120 may also generate the refresh address ADDR_R in a fast refresh mode when a command other than the refresh command is applied to the semiconductor memory device while the semiconductor memory device is performing a fast refresh with command skip operation, and may generate the refresh address ADDR_R in a fast refresh with command skip mode when a command other than the refresh command is not applied to the semiconductor memory device while the semiconductor memory device is performing the fast refresh with command skip operation.

The semiconductor memory device 100 of FIG. 3 is not limited by the choice of memory cell technology. As examples, the semiconductor memory device 100 may be embodied as a volatile memory chip or chips, such as a dynamic random access memory (DRAM) chip or a static random access memory (SRAM) chip. Alternatively, the semiconductor memory device 100 may be embodiment as a non-volatile memory chip or chips, such as a flash memory chip, a phase change memory chip, a magnetic random access memory (MRAM) chip, or a resistive random access memory (RRAM) chip. Further, the semiconductor memory device 100 may include a combination of different memory technologies, and may include additional functionality and elements that are not described above.

Figure 4:
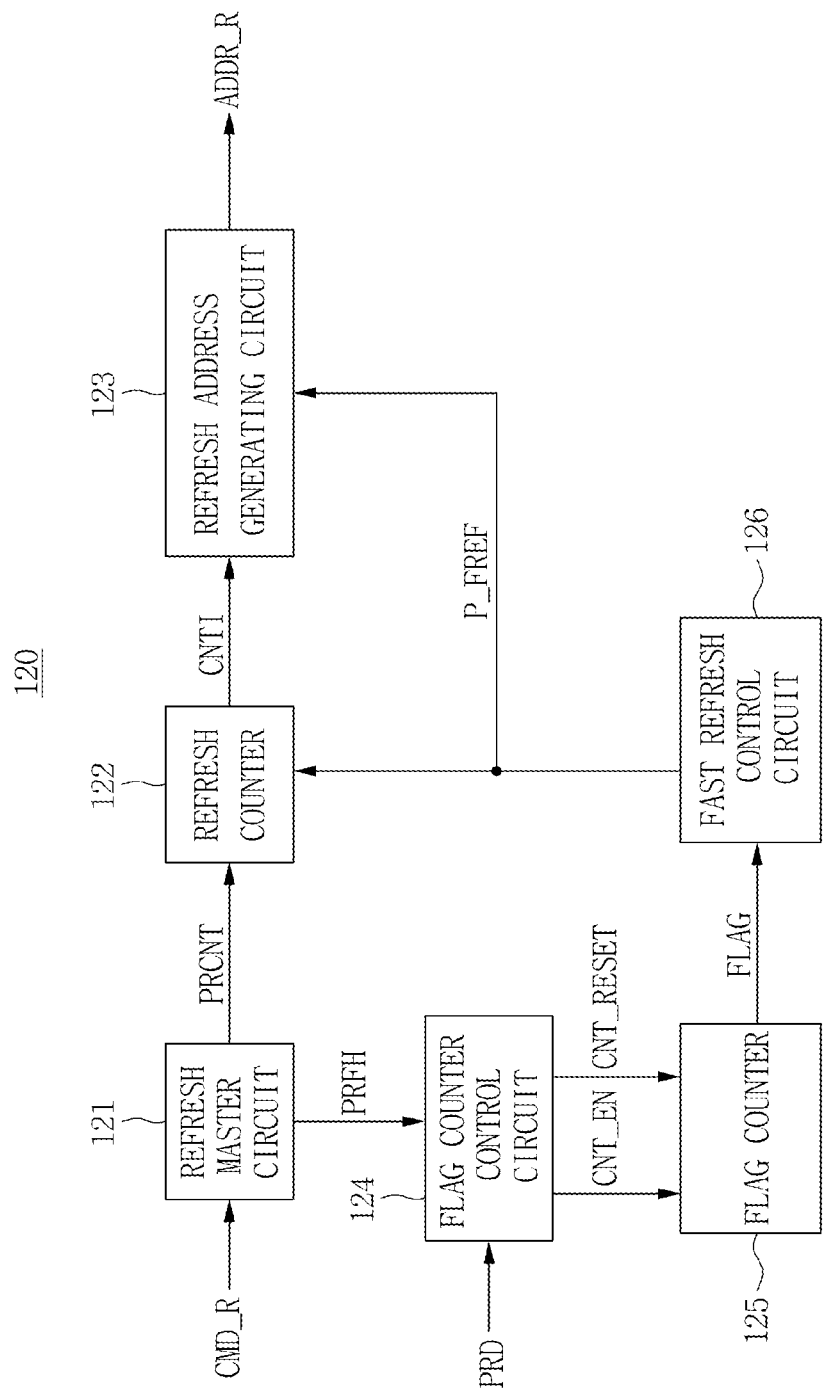
FIG. 4 is a block diagram illustrating an example of a refresh control circuit included in the semiconductor memory device of FIG. 3.

FIG. 4 is a block diagram illustrating an example of a refresh control circuit 120 included in the semiconductor memory device 100 of FIG. 3.

Referring to FIG. 4, the refresh control circuit 120 of this example includes a refresh master circuit 121, a flag counter control circuit 124, a flag counter 125, a fast refresh control circuit 126, a refresh counter 122 and a refresh address generating circuit 123.

The refresh master circuit 121 receives a refresh command CMD_R (e.g., from the command decoder 110 of FIG. 3), and generates a refresh counter control signal PRCNT and a refresh master signal PRFH based on the refresh command CMD_R. The flag counter control circuit 124 receives the active master signal PRD (e.g., from the command decoder 110 of FIG. 3) and the refresh master signal PRFH, and generates a counter enable signal CNT_EN and a counter reset signal CNT_RESET based on the active master signal PRD and the refresh master signal PRFH. The flag counter 125 receives the counter enable signal CNT_EN and the counter reset signal CNT_RESET, and executes a counting operation based on these signals. Namely, in this example, the flag counter 25 initiates a counting operation in response to the counter enable signal CNT_EN, stops the counting operation in response to the counter reset signal CNT_RESET, and generates a corresponding flag signal FLAG The flag counter 125 may, for example, enable the flag signal FLAG when a count number reaches a target value. The flag signal FLAG is applied to the fast refresh control circuit 126, which generates a fast refresh control signal P_FREF in response to the flag signal FLAG. For example, the fast refresh control circuit 126 may disable the fast refresh control signal P_FREF when the flag signal FLAG is enabled. The refresh counter 122 receives the refresh counter control signal PRCNT from the refresh master circuit 121 and the fast refresh control signal P_FREF from the fast refresh control circuit 126, and generates a counting signal CNTI based on the refresh counter control signal PRCNT and the fast refresh control signal P_FREF. The refresh address generating circuit 123 receives the counting signal CNTI from the refresh counter 122 and the fast refresh control signal P_FREF from the fast refresh control circuit, and generates the refresh address ADDR_R based on the counting signal CNTI and the fast refresh control signal P_FREF.

The embodiments described above will now be further described by way of examples as represented by the timing diagrams FIGS. 5 to 10. These examples are presented for further understanding of methods of and devices for refreshing a semiconductor memory device in accordance with embodiments of the inventive concepts.

Figure 5:
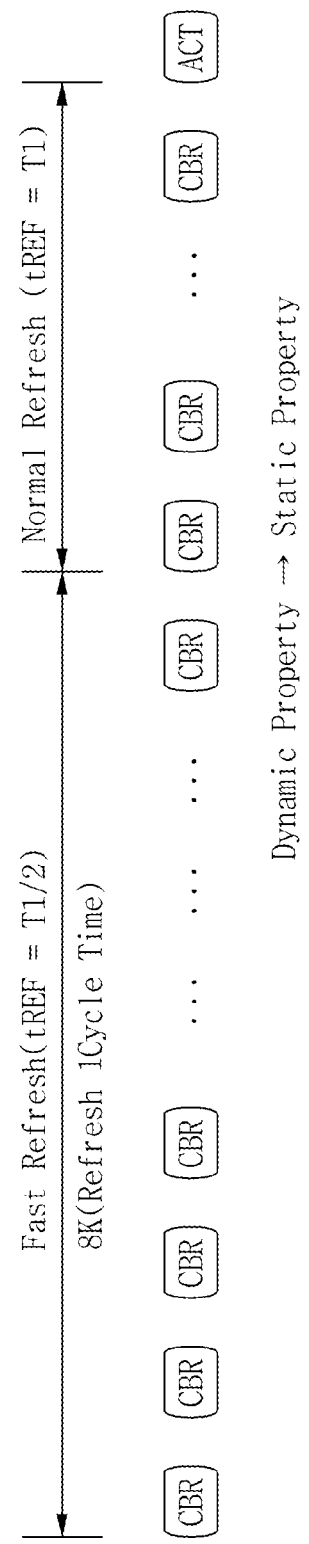
FIGS. 5, 6, 7, 8, 9 and 10 are timing diagrams for reference in describing methods of refreshing a semiconductor memory device in accordance with embodiments of the inventive concepts.
Figure 6:
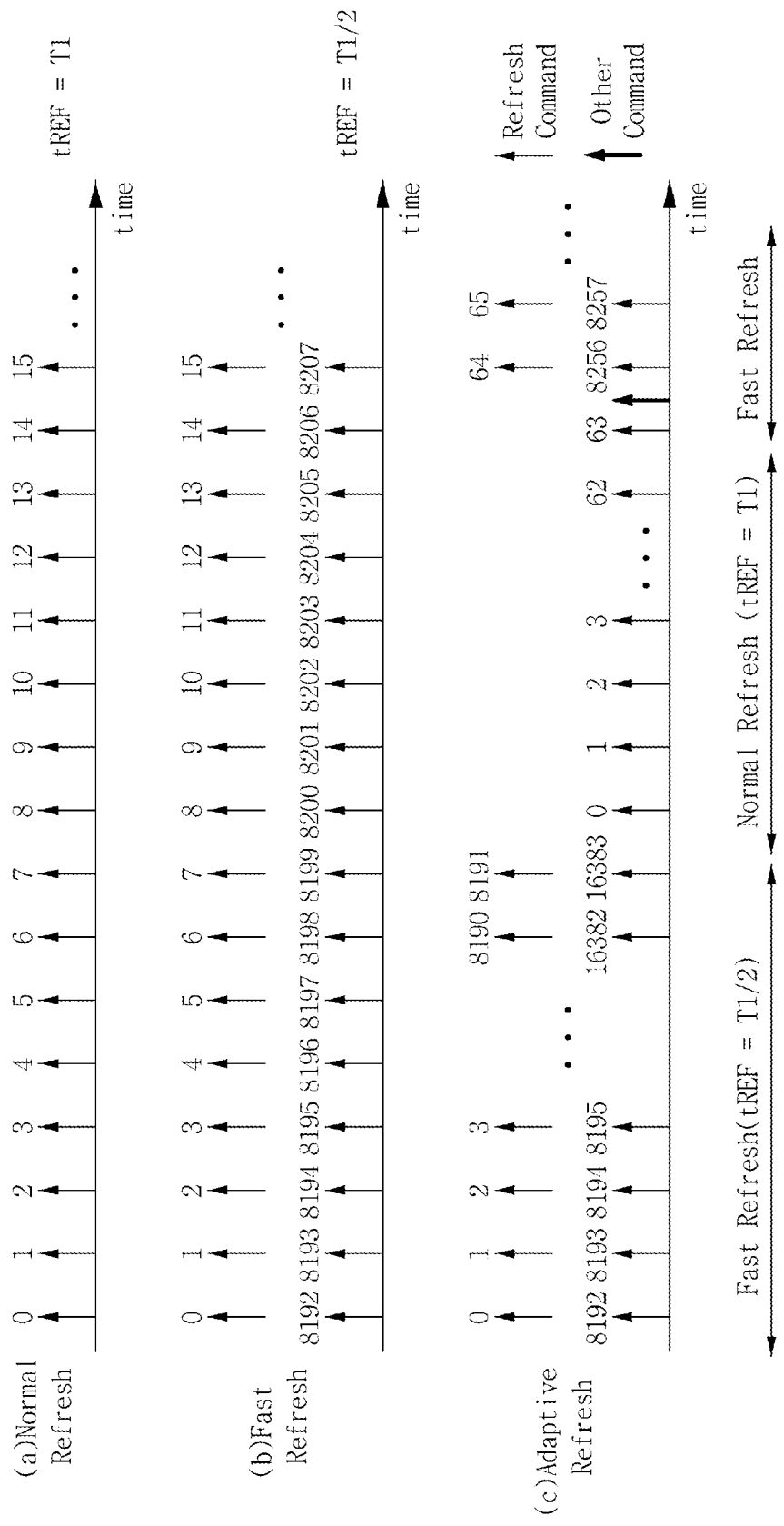
Figure 7:
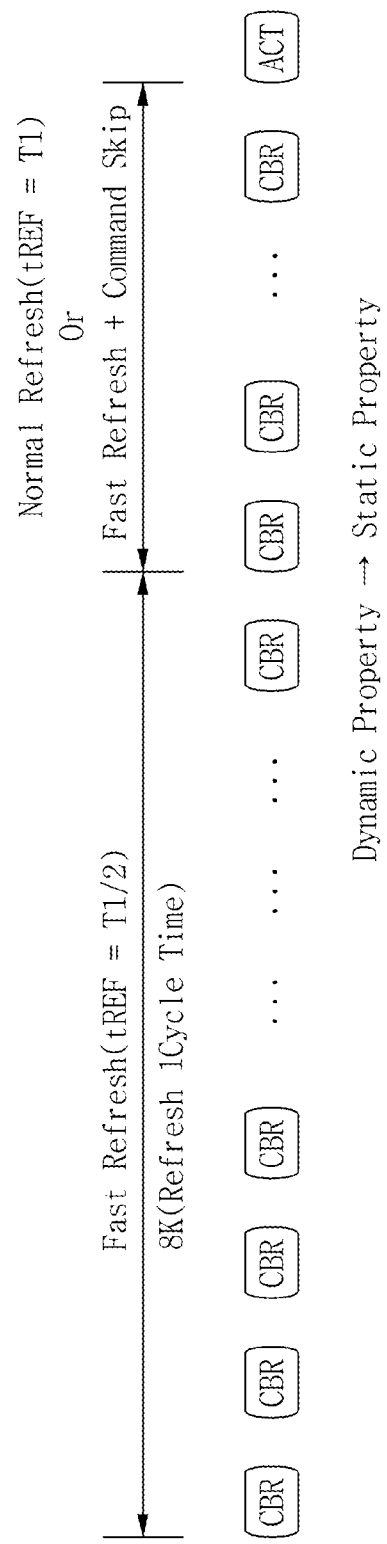

FIGS. 5 and 6, illustrate the case where no command other than a refresh command is received by the semiconductor device during one cycle of the fast refresh operation. In particular, when an auto refresh command (CBR) is continuously executed in a fast refresh operation, and no other command is applied to the semiconductor memory device in one refresh cycle, properties of memory cells included in the memory cell array may change from relatively dynamic to relatively static. That is to say, when the memory cell properties become static, a supply voltage is relatively stable, disturbance among adjacent memory cells is decreased, and refresh properties of the semiconductor memory device are generally improved. In this condition, according to the present embodiment, the semiconductor memory device terminates the fast refresh operation in favor of a normal refresh operation, to thereby increase a refresh time tREF. This adaptive approach to the refresh operation allows for a decrease in refresh current consumption. As one example, the refresh time (T1/2) in a fast refresh operation may be 32 ms, and the refresh time (T1) in the normal refresh operation may be 64 ms.

Timing diagram (a) of FIG. 6 illustrates a normal refresh operation having a refresh time T1, and timing diagram (b) of FIG. 6 illustrates a fast refresh operation having a refresh time T1/2. In these figures, the upwardly pointing arrows denote a refresh command, and the numbers above the arrows denote a word line number associate with the command. It will be understood that these timing diagrams are merely presented as examples.

As mentioned above, the refresh method of the present embodiment is adaptive. This is shown by way of example in timing diagram (c) of FIG. 6. Initially, a fast refresh operation is carried out, and since no command other than a refresh command is received during one refresh cycle of the fast refresh operation, the semiconductor memory device is switched to a normal refresh operation, thereby reducing power consumption. This operation corresponds to that shown in FIG. 5 discussed above.

According to an embodiment of the inventive concept, if a command other than the refresh command is received during the normal refresh operation, the semiconductor memory device is switch back to the fast refresh operation. This was discussed above in connection with operation S4 of FIG. 1, and an example is shown in the adaptive refresh of timing diagram (c) of FIG. 6. There, a command other than a refresh command is received after a normal refresh associated with word line 63, and thus the fast refresh operation is again executed.

FIG. 7 is similar to FIG. 5 described above, except that FIG. 7 shows that a fast refresh with command skip operation may be carried out in place of the normal refresh operation of FIG. 5. This was discussed above in connection with operation S5 of FIG. 2. Again, when an auto refresh command (CBR) is continuously executed in a fast refresh operation, and no other command is applied to the semiconductor memory device in one refresh cycle, properties of memory cells included in the memory cell array may change from relatively dynamic to relatively static. In this condition, according to the present embodiment, the semiconductor memory device terminates the fast refresh operation in favor of fast refresh with command skip operation. As will FIG. 5, the adaptive approach to the refresh operation of FIG. 7 allows for a decrease in refresh current consumption.

Figure 8:
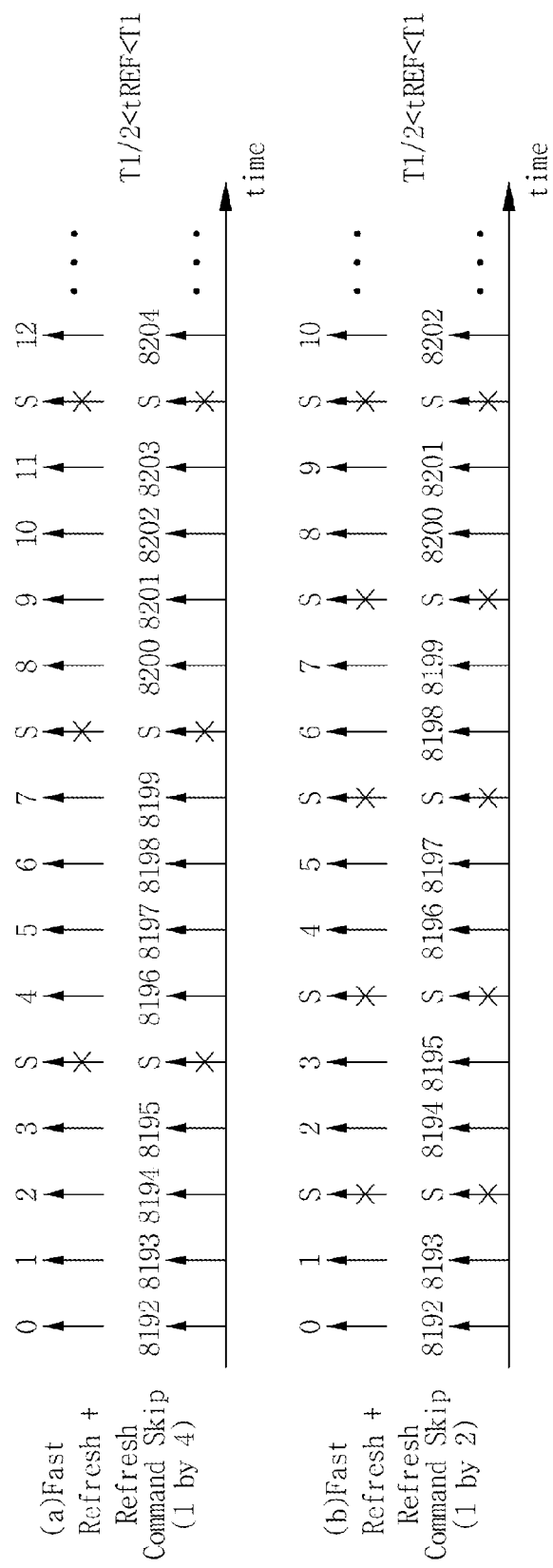

Examples of the fast refresh with command skip operation are shown in FIG. 8. In particular, in the timing diagram (a) of FIG. 8, one auto refresh command is skipped after four auto refresh commands are applied, and in the timing diagram (b) of FIG. 8, one auto refresh command is skipped after two auto refresh commands are applied. Since refresh operations are skipped in this manner, a current consumed during the refresh operation may be decreased. For example, when the refresh time in a fast refresh operation is 32 ms and the refresh time in the normal refresh operation is 64 ms, the refresh time may be 40 ms in the case of the timing diagram (a) of FIG. 8, and the refresh time may be 48 ms in the case of the timing diagram (b) of FIG. 8. In both cases, according to these examples, a refresh time tREF is between T1/2 and T1.

Figure 9:
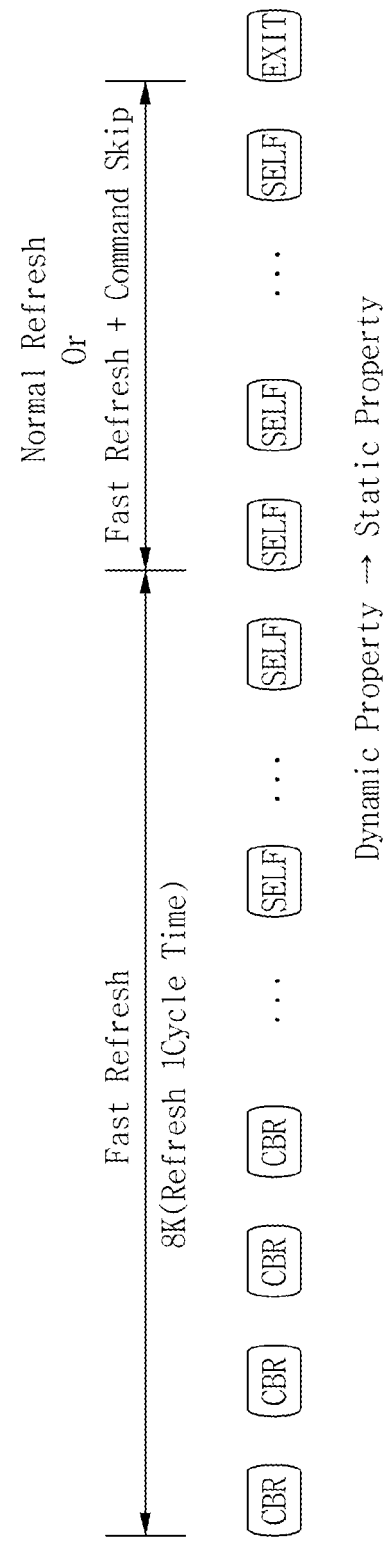

FIG. 9 illustrates an example in which the semiconductor memory device enters a self-refresh mode (SELF) during the refresh operation. In this case, the refresh control circuit of the semiconductor memory device may continuously and on its own operate the flag counter after receipt of one or more auto refresh commands (CBR). In the example of FIG. 9, the semiconductor memory device enters the self-refresh mode part way through the fast refresh operation and throughout the normal refresh operation or the fast refresh operation with command skip operation. As with the previous examples, the refresh method of FIG. 9 may decrease power consumption during the refresh operation.

Figure 10:
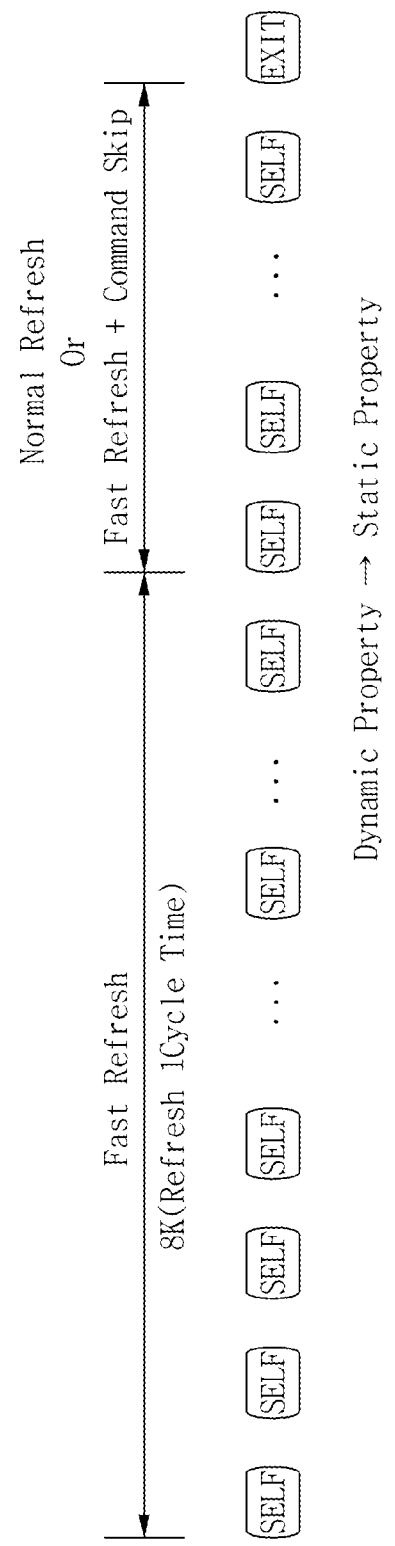

FIG. 10 illustrates another example in which refresh control circuit of the semiconductor memory device operates in the self-refresh mode throughout the fast refresh operation and the normal refresh or fast refresh with command skip operation. Again, as with the previous examples, the refresh method of FIG. 10 may decrease power consumption during the refresh operation.

Figure 11:
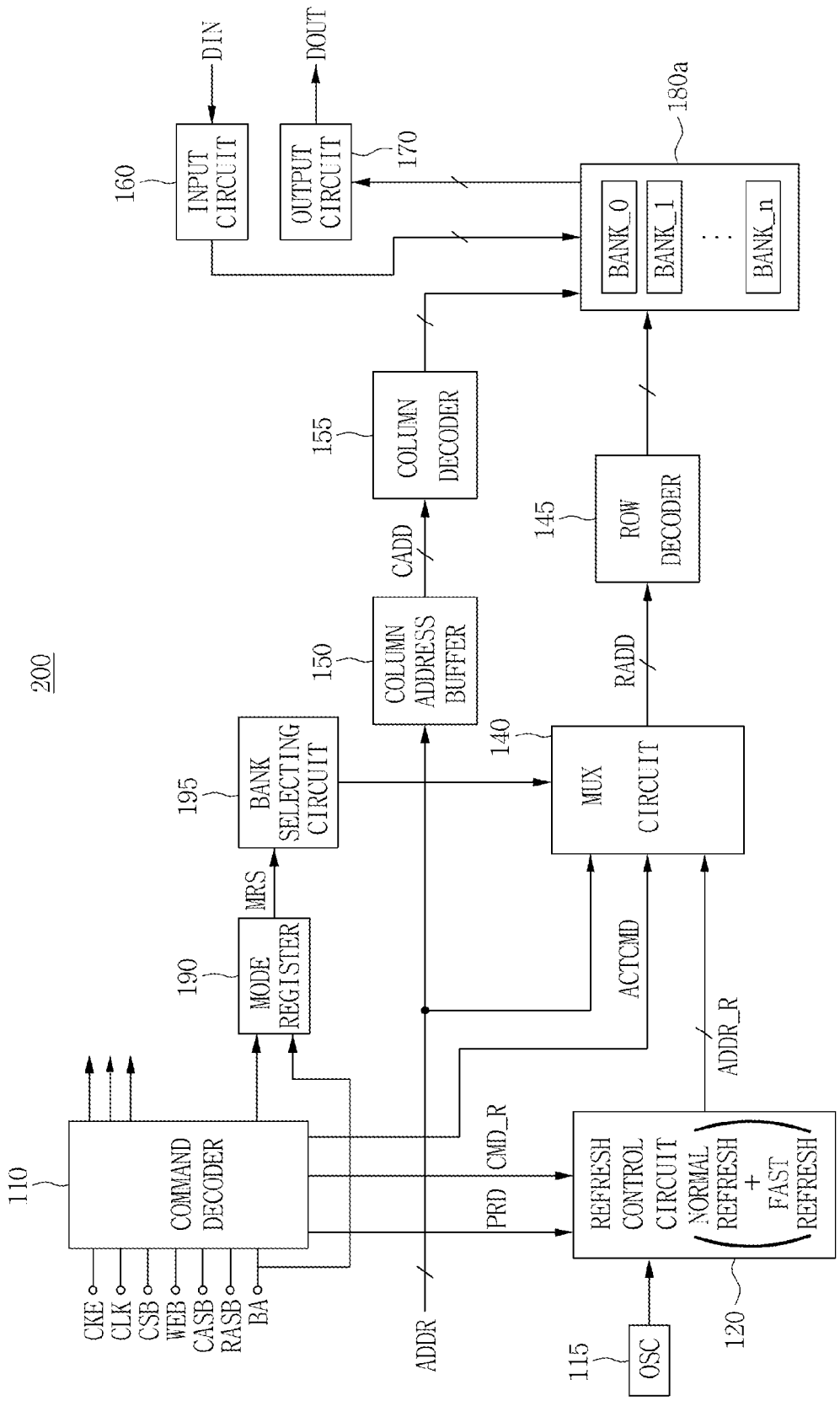
FIG. 11 is a block diagram illustrating a semiconductor memory device including a refresh control circuit in accordance with another embodiment of the inventive concept.

FIG. 11 is a block diagram illustrating a semiconductor memory device 200 including a refresh control circuit in accordance with another embodiment of the inventive concept.

Referring to FIG. 11, the semiconductor memory device 200 may include a command decoder 110, an oscillator 115, a refresh control circuit 120, a multiplexing circuit 140, a row decoder 145, a column address buffer 150, a column decoder 155, an input circuit 160, an output circuit 170, a memory cell array 180, a mode register 190 and a bank selecting circuit 195.

The mode register 190 performs programming using the commands, the bank address BA, and an external address ADDR received from the command decoder 110, and stores the programmed contents. The bank selecting circuit 195 receives a mode register signal MRS having information of a memory bank on which a refresh operation is to be performed. The bank selecting circuit 195 generates a selection signal based on the mode register signal MRS. The multiplexing circuit 140 operates in response to an active command ACTCMD. The multiplexing circuit 140 selects one of an external address ADDR and the self-refresh address ADDR_SR in response to bits of the selection signal to generate a row address RADD.

The circuit structure of FIG. 11 is similar to the circuit of FIG. 3, except that the semiconductor memory device 200 includes the mode register 190 and the bank selecting circuit 195, and the memory cell array 180a includes a plurality of banks BANK_0 to BANK_n. Therefore, the semiconductor memory device of the example FIG. 11 is configured to execute refresh operations on the basis of memory banks. Otherwise, the circuit structure of FIG. 11 operates like that of FIG. 3, and a further detailed description is omitted here to avoid redundancy.

Figure 12:
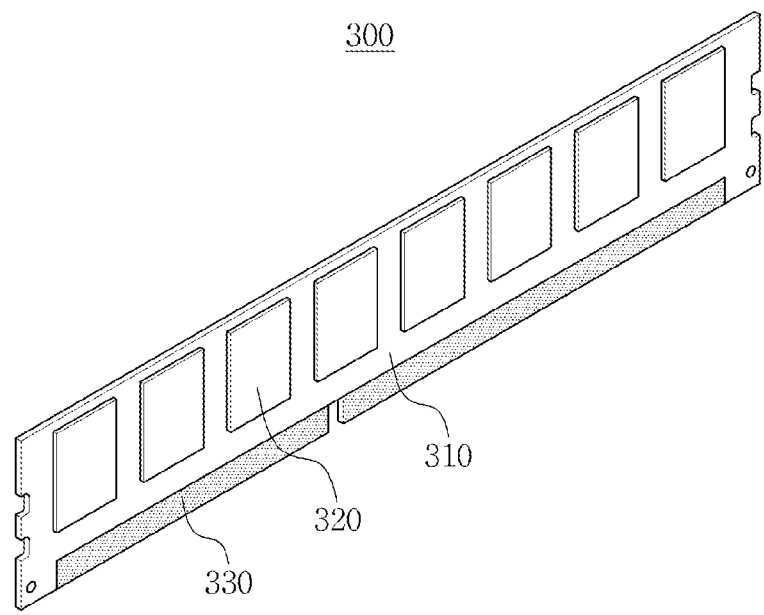
FIGS. 12, 13 and 14 are perspective views illustrating memory modules including a semiconductor memory device in accordance with embodiments of the inventive concepts.
Figure 13:
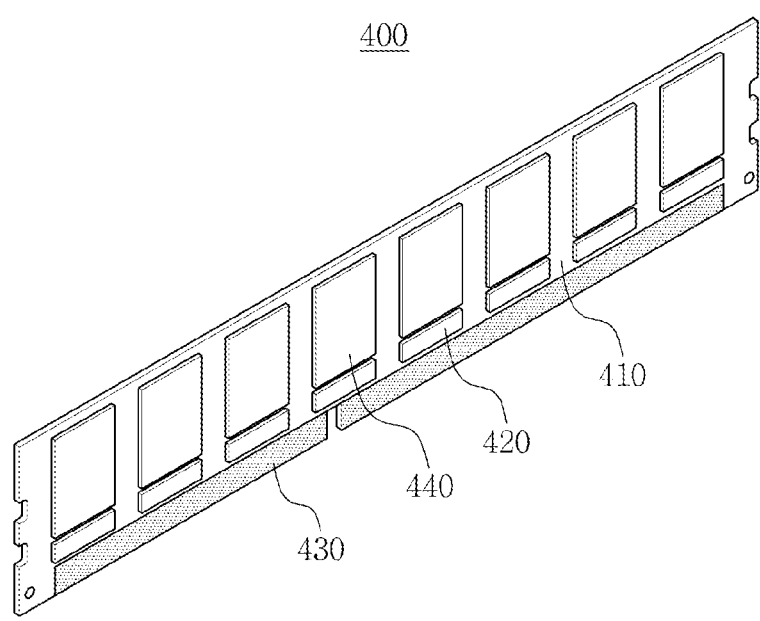
Figure 14:
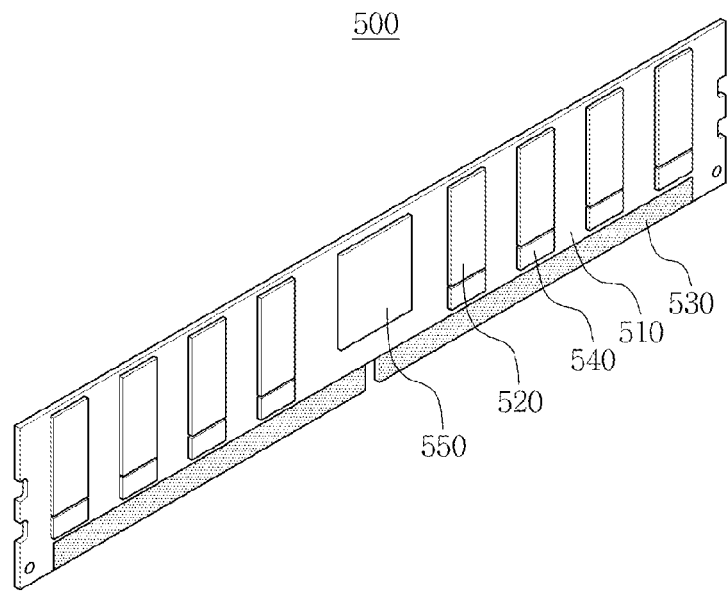

FIGS. 12 to 14 are diagrams illustrating memory modules including the semiconductor memory device in accordance with embodiments of the inventive concepts.

Referring to FIG. 12, the memory module 300 may include a printed circuit board (PCB) 310, a plurality of memory chips 320, and a connector 330. The plurality of memory chips 320 may be bonded to top and bottom surfaces of the PCB 310. The connector 330 may be electrically connected to the plurality of memory chips 320 through conductive lines (not shown). Also, the connector 330 may be connected to a slot of an external host.

Referring to FIG. 13, the memory module 400 may include a PCB 410, a plurality of memory chips 440, a connector 430, and a plurality of buffers 420. Each of the plurality of buffers 420 may be disposed between the memory chips 420 and the connector 430.

The memory chips 440 and the buffers 420 may be provided on top and bottom surfaces of the PCB 410. The memory chips 440 and the buffers 420 formed on the top and bottom surfaces of the PCB 410 may be connected through a plurality of via holes.

Referring to FIG. 14, the memory module 500 may include a PCB 510, a plurality of memory chips 520, a connector 530, a plurality of buffers 540, and a controller 550.

The memory chips 520 and the buffers 540 may be provided on top and bottom surfaces of the PCB 510. The memory chips 520 and the buffers 540 formed on the top and bottom surfaces of the PCB 510 may be connected through a plurality of via holes.

In FIGS. 12 to 14, the memory chips may include the semiconductor memory devices in accordance with embodiments of the inventive concepts. Therefore, the memory chips may perform a refresh operation in a fast refresh mode and a normal refresh mode, or perform the refresh operation in a fast refresh mode and a fast refresh with command skip mode. As discussed previously, the memory chips may thus decrease power consumption during a refresh operation.

Figure 15:
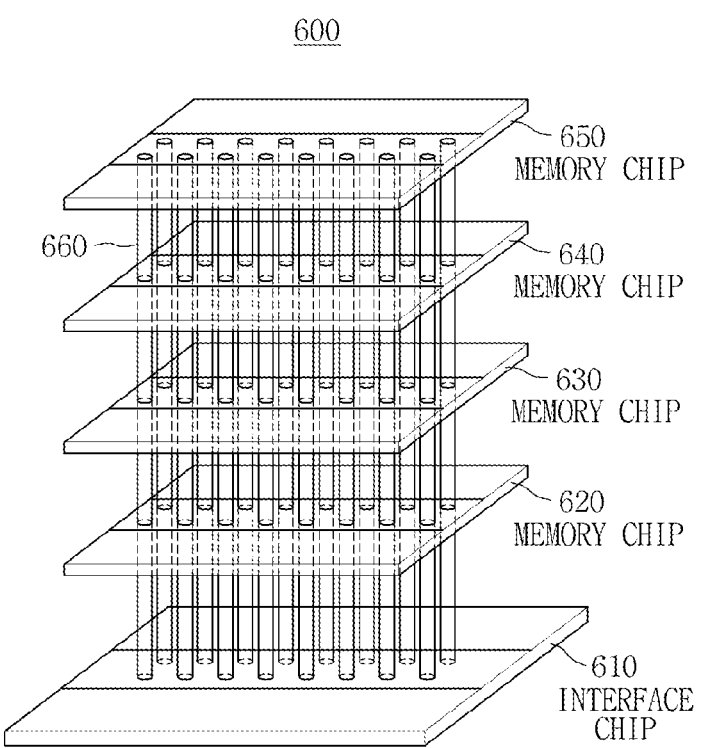
FIG. 15 is a schematic perspective view illustrating an example of a stacked semiconductor device including a semiconductor memory device in accordance with embodiments of the inventive concepts.

FIG. 15 is a schematic perspective view illustrating an example of a stacked semiconductor device 600 including the semiconductor memory device in accordance with embodiments of the inventive concepts.

Referring to FIG. 15, the stacked semiconductor device 600 may include an interface chip 610, and memory chips 620, 630, 640 and 650 which are electrically connected through through-silicon vias 660. Although the through-silicon vias 660 disposed in two rows are shown in FIG. 15, the stacked semiconductor device 600 may include any number of through-silicon vias.

The memory chips 620, 630, 640 and 650 included in the stacked semiconductor device 600 may include the semiconductor memory device in accordance with the embodiments of the inventive concepts. Therefore, the memory chips 620, 630, 640 and 650 may perform a refresh operation in a fast refresh mode and a normal refresh mode, or perform the refresh operation in a fast refresh mode and a fast refresh with command skip mode. As described previously, the memory chips may thus decrease power consumption during a refresh operation.

The interface chip 610 may perform interfacing between the memory chips 620, 630, 640 and 650 and the external devices.

Figure 16:
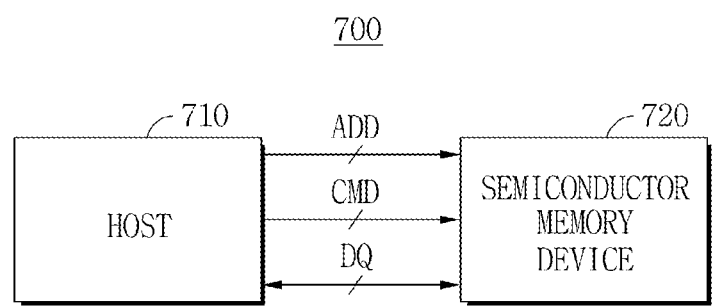
FIGS. 16 and 17 are block diagrams illustrating memory systems including a semiconductor memory device in accordance with embodiments of the inventive concepts.
Figure 17:
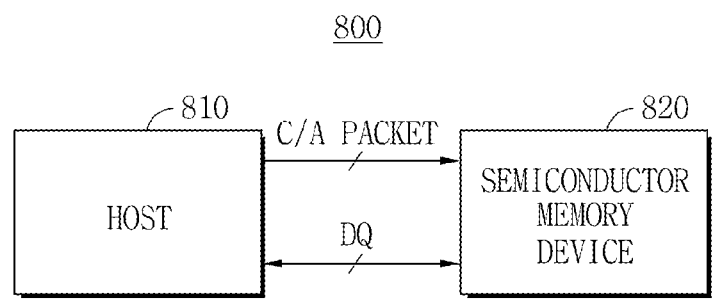

FIGS. 16 and 17 are block diagrams illustrating memory systems including the semiconductor memory device in accordance with embodiments of the inventive concepts.

Referring to FIG. 16, the memory system 700 may include a host 710 and a semiconductor memory device 720.

The host 710 may generate an address signal ADD and a command CMD, and provide the address signal ADD and the command CMD to the semiconductor memory device 720 through buses. Data DQ may be transmitted from the host 710 to the data memory device 720 through the buses, or transmitted from the semiconductor memory device 720 to the host 710 through the buses.

The semiconductor memory device 720 may include semiconductor memory devices in accordance with embodiments of the inventive concepts. Therefore, the semiconductor memory device 720 may perform a refresh operation in a fast refresh mode and a normal refresh mode, or perform the refresh operation in a fast refresh mode and a fast refresh with command skip mode. As described previously, the semiconductor memory device 720 may thus decrease power consumption during a refresh operation.

Referring to FIG. 17, the memory system 800 may include a host 810 and a data memory device 820. In the memory system 800 of FIG. 17, the command CMD and an address ADD are integrated to form a packetized signal C/A, as distinguished from the memory system 700 of FIG. 16.

Figure 18:
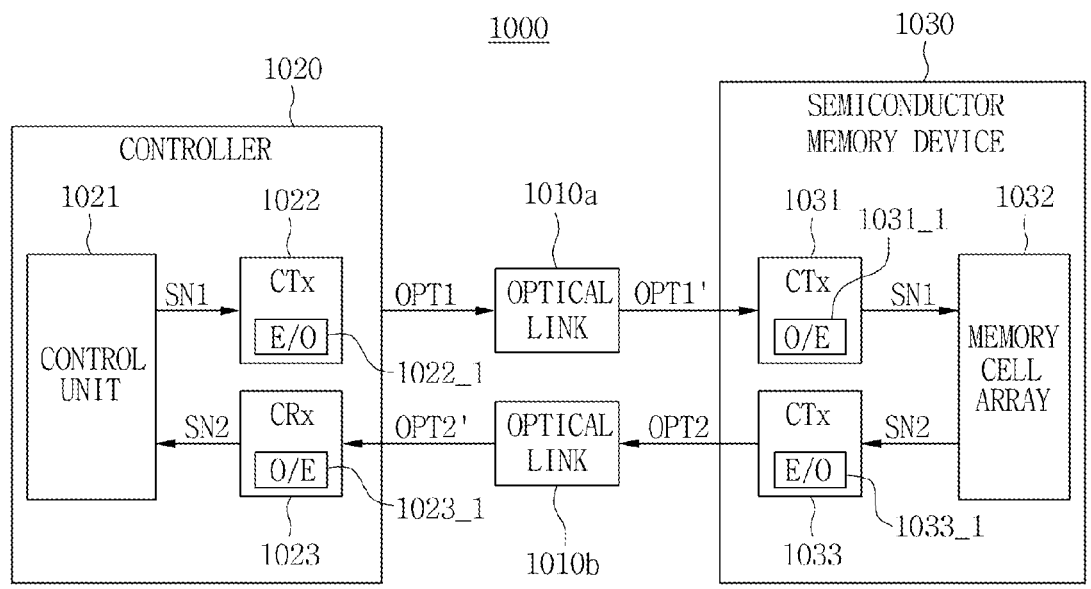
FIG. 18 is a block diagram illustrating an example of a memory system including a semiconductor memory device and an optical link in accordance with an embodiment of the inventive concept.

FIG. 18 is a block diagram illustrating an example of a memory system including the semiconductor memory device and an optical link in accordance with an embodiment of the inventive concept.

Referring to FIG. 18, the memory system 1000 may include a controller 1020, a data memory device 1030, and a plurality of optical links 1010a and 1010b configured to interconnect the controller 1020 and the data memory device 1030. The controller 1020 may include a control unit 1021, a first transmitter 1022, and a first receiver 1023. The control unit 1021 may transmit a control signal SN1 to the first transmitter 1022.

The first transmitter 1022 may include a first optical modulator 1022_1, which may convert the control signal SN1, which is an electric signal, into a first optical transmission signal OPT1, and transmit the first optical transmission signal OPT1 to the optical link 1010a.

The first receiver 1023 may include a first optical demodulator 1023_1, which may convert a second optical receiving signal OPT2' received from the optical link 1010b into a data signal SN2, which is an electric signal, and transmit the data signal SN2 to the control unit 1021.

The data memory device 1030 may include a second receiver 1031, a memory cell array 1032, and a second transmitter 1033. The second receiver 1031 may include a second optical modulator 1031_1, which may convert a first optical receiving signal OPT1' received from the optical link 1010a into the control signal SN1, which is the electric signal, and transmit the control signal SN1 to the memory cell array 1032.

In the memory cell array 1032, data may be written under the control of the control signal SN1, or the data signal SN2 output from the memory cell array 1032 may be transmitted to the second transmitter 1033.

The second transmitter 1033 may include a second optical modulator 1033_1, which may convert the data signal SN2, which is the electric signal, into a second optical data signal OPT2, and transmit the second optical data signal OPT2 to the optical link 1010b.

The data memory device 1030 may include the semiconductor memory device according to embodiments of the inventive concepts. Therefore, the semiconductor memory device 1030 may perform a refresh operation in a fast refresh mode and a normal refresh mode, or perform the refresh operation in a fast refresh mode and a fast refresh with command skip mode. As described previously, the semiconductor memory device 1030 may thus decrease power consumption during a refresh operation.

Figure 19:
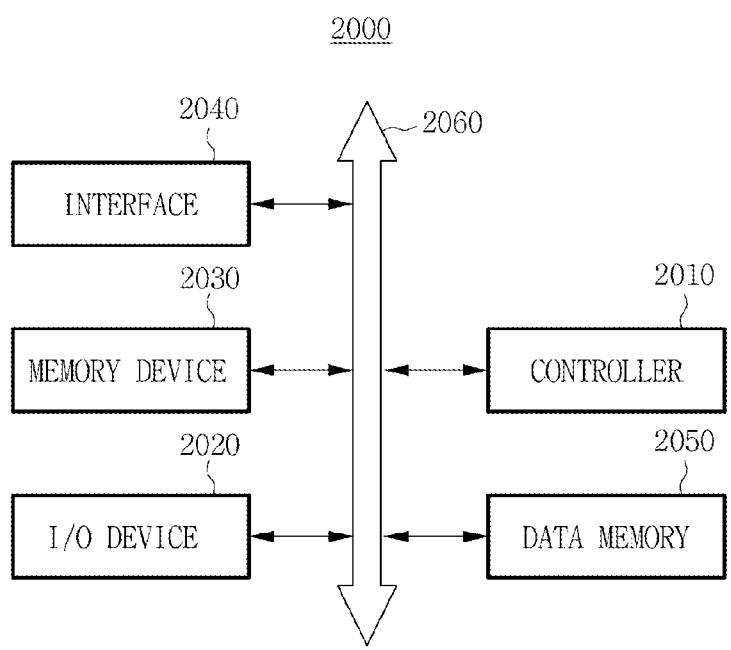
FIG. 19 is a block diagram illustrating an example of an electronic system including a semiconductor memory device in accordance with an embodiment of the inventive concept.

FIG. 19 is a block diagram illustrating an example of an electronic system including the semiconductor memory device in accordance with an embodiment of the inventive concept.

Referring to FIG. 19, the electronic system 2000 in accordance with embodiment of the inventive concept may include a controller 2010, an input and output device 2020, a memory device 2030, an interface 2040 and a bus 2060. The memory device 2030 may be generally a semiconductor memory device for storing a program and data. The memory device 2030 may include the semiconductor memory device in accordance with embodiments of the inventive concept. Therefore, the memory device 2030 may perform a refresh operation in a fast refresh mode and a normal refresh mode, or perform the refresh operation in a fast refresh mode and a fast refresh with command skip mode. As described previously, the semiconductor memory device 1030 may thus decrease power consumption during a refresh operation.

The bus 2060 may function to provide a path in which data is mutually transferred among the controller 2010, the input and output device 2020, the memory device 2030 and the interface 2040.

The controller 2010 may include any one of logic devices that can perform functions of at least one of a microprocessor, a digital signal processer, and a microcontroller, or functions similar to those. The input and output device 2020 may include at least one selected from a keypad, a keyboard, and a display device. The memory device 2030 may function to store data and/or instructions performed by the controller 2010.

The memory device 2030 may include a volatile memory chip, such as a dynamic random access memory (DRAM) and a static random access memory (SRAM), a non-volatile memory chip, such as a flash memory, a phase change memory, a magnetic random access memory (MRAM), or a resistive random access memory (RRAM), or a combination of thereof.

The interface 2040 may function to transmit/receive data to/from a communication network. The interface 2040 can include an antenna, wired or wireless transceivers, or the like, to transmit and receive data either wired or wirelessly. In addition, the interface 2040 may include optical fibers to transmit and receive data through the optical fibers. The electronic system 2000 may be further provided with an application chipset, a camera image processor, and an input/output (I/O) device.

The electronic system 2000 may be implemented as a mobile system, a personal computer, an industrial computer, or a logic system that may perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 2000 is an apparatus that can perform wireless communication, the electronic system 2000 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

Embodiments of the inventive concepts may be applied to a semiconductor memory device and, and a memory system including the semiconductor memory device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of refreshing a semiconductor memory device including a memory cell array, the method comprising:
    performing a first refresh operation for memory cells included in the memory cell array;
    determining whether a command other than a refresh command is applied to the semiconductor memory device in a refresh cycle of the first refresh operation;
    continuing to perform the first refresh operation when a command other than the refresh command is applied to the semiconductor memory device in one refresh cycle of the first refresh operation; and
    performing a second refresh operation when a command other than the refresh command is not applied to the semiconductor memory device in one refresh cycle of the first refresh operation,
    wherein a refresh time of the second refresh operation is greater than a refresh time of the first refresh operation.

2. The method of claim 1, wherein the refresh time of the second refresh operation is twice the refresh time of the first refresh operation.

3. The method of claim 1, wherein the second refresh operation is a normal refresh operation which includes execution of refresh commands for each of word lines of the semiconductor device.

4. The method of claim 1, wherein the second refresh operation is a fast refresh with command skip operation which includes skipping of refresh commands for each of a given number of word lines of the semiconductor memory device.

5. The method of claim 1, wherein a power consumption of the second refresh operation is less than a power consumption of the first refresh operation.

6. The method of claim 1, further comprising:
determining whether a command other than the refresh command is applied to the semiconductor memory device while the semiconductor memory device is performing the second refresh operation;
again performing the first refresh operation when a command other than the refresh command is applied to the semiconductor memory device while the semiconductor memory device is performing the second refresh operation; and
continuing to perform the second refresh operation when a command other than the refresh command is not applied to the semiconductor memory device while the semiconductor memory device is performing the second refresh operation.

7. The method of claim 1, wherein the command other than the refresh command is an active command, a read command or a write command.

8. The method of claim 1, wherein the refresh command is an auto refresh command or a self refresh command.

9. The method of claim 1, wherein memory cells included in the memory cell array have static properties when a command other than the refresh command is not applied to the semiconductor memory device in one refresh cycle of the first refresh operation.

10. A semiconductor memory device comprising:
a refresh control circuit configured to generate a refresh address based on an active master signal and a refresh command;
a multiplexing circuit configured to select one of an external address and the refresh address to generate a row address;
a row decoder configured to decode the row address and provide the decoded row address to a memory cell array;
a column address buffer configured to generate a column address based on the external address; and
a column decoder configured to decode the column address and provide the decoded column address to the memory cell array,
wherein the semiconductor memory device is configured to continue performance of a first refresh operation when a command other than the refresh command is applied to the semiconductor memory device in one refresh cycle of the first refresh operation, and to perform a second refresh operation when a command other than the refresh command is not applied to the semiconductor memory device in one refresh cycle of the first refresh operation, wherein a refresh time of the second refresh operation is greater than a refresh time of the first refresh operation.

11. The device of claim 10, wherein the second refresh operation is a normal refresh operation which includes execution of refresh commands for each of word lines of the semiconductor device.

12. The device of claim 11, wherein the refresh control circuit is configured to generate the refresh address in a fast refresh mode when a command other than the refresh command is applied to the semiconductor memory device in one refresh cycle of the first refresh operation, and configured to generate the refresh address in a normal refresh mode when a command other than the refresh command is not applied to the semiconductor memory device in one refresh cycle of the first refresh operation.

13. The device of claim 12, wherein the refresh control circuit is further configured to generate the refresh address in the fast refresh mode when a command other than the refresh command is applied to the semiconductor memory device while the semiconductor memory device is performing the normal refresh operation, and configured to generate the refresh address in the normal refresh mode when a command other than the refresh command is not applied to the semiconductor memory device while the semiconductor memory device is performing the normal refresh operation.

14. The device of claim 10, wherein the second refresh operation is a fast refresh with command skip operation which includes skipping of refresh commands for each of a given number of word lines of the semiconductor memory device.

15. The device of claim 14, wherein the refresh control circuit is configured to generate the refresh address in a fast refresh mode when a command other than the refresh command is applied to the semiconductor memory device in one refresh cycle of the first refresh operation, and configured to generate the refresh address in a fast refresh with command skip mode when a command other the refresh command is not applied to the semiconductor memory device in one refresh cycle of the first refresh operation.

16. The device of claim 15, wherein the refresh control circuit is further configured to generate the refresh address in the fast refresh mode when a command other than the refresh command is applied to the semiconductor memory device while the semiconductor memory device is performing the fast refresh with command skip operation, and configured to generate the refresh address in the fast refresh with command skip mode when a command other than the refresh command is not applied to the semiconductor memory device while the semiconductor memory device is performing the fast refresh with command skip operation.

17. The device of claim 10, wherein the refresh control circuit comprises:
a refresh master circuit configured to generate a refresh counter control signal and a refresh master signal based on the refresh command;
a flag counter control circuit configured to generate a counter enable signal and a counter reset signal based on the active master signal and the refresh master signal;
a flag counter configured to perform a counting operation in response to the counter enable signal, and configured to stop the counting operation in response to the counter reset signal, and generate a flag signal;
a fast refresh control circuit configured to generate a fast refresh control signal in response to the flag signal;
a refresh counter configured to generate a counting signal based on the refresh counter control signal and the fast refresh control signal; and
a refresh address generating circuit configured to generate the refresh address based on the counting signal and the fast refresh control signal.

18. The device of claim 17, wherein the flag counter is configured to enable the flag signal when the number of counting reaches a target value.

19. The device of claim 17, wherein the fast refresh control circuit is configured to disable the fast refresh control signal when the flag signal is enabled.

20. The device of claim 10, wherein a power consumption of the first refresh operation is more than a power consumption of the second refresh operation.

* * * * *